United States Patent
Takahashi

(10) Patent No.: US 6,593,751 B2
(45) Date of Patent: Jul. 15, 2003

(54) MOTOR INSULATION FAULT DETECTION BY SENSING GROUND LEAK CURRENT

(75) Inventor: Toshio Takahashi, Rancho Palos Verdes, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/866,645

(22) Filed: May 30, 2001

(65) Prior Publication Data

US 2001/0048310 A1 Dec. 6, 2001

Related U.S. Application Data

(60) Provisional application No. 60/207,339, filed on May 30, 2000.

(51) Int. Cl.[7] ........................ H01H 31/12; G01R 31/14; G01R 31/34
(52) U.S. Cl. ........................ 324/551; 324/509; 324/545; 324/772
(58) Field of Search ................................ 324/551, 509, 324/772, 541, 544, 545, 522; 361/42, 47, 45

(56) References Cited

U.S. PATENT DOCUMENTS 3,891,895 A * 6/1975 Wittlinger .................. 324/509
5,514,967 A * 5/1996 Zelm ........................... 324/551
5,973,500 A * 10/1999 Moreau et al. ............. 324/509

* cited by examiner

Primary Examiner—N. Le
Assistant Examiner—James Kerveros
(74) Attorney, Agent, or Firm—Ostrolenk, Faber, Gerb & Soffen, LLP

(57) ABSTRACT

Motor insulation degradation is determined using circuitry to sense the common mode leakage current from the ground wire cable. In a preferred embodiment of the invention, a small current transformer detects the common mode leakage current flowing in the ground wire cable of the motor controller circuit. A single pole low pass filter generates an average leakage current signal from the sensed current. The average leakage current signal is converted to a PWM signal. A pulse generator receives the PWM signal and generates pulse signals at the rising and falling edges of the PWM signal. A pair of level shifters receive the rising edge and falling edge pulse signals and transpose those signals from a floating high voltage to a voltage referenced to ground. A pulse reconstruction circuit receives the level shifted pulse signals and reconstructs a pulse width modulated signal having a duty cycle which varies with respect to the magnitude of the common mode leakage current. This output signal is input directly to a microcontroller or a digital signal processor to calculate and determine the amount of motor insulation degradation.

8 Claims, 5 Drawing Sheets

MOTOR INSULATION FAULT DETECTION BY SENSING GROUND LEAK CURRENT

This application claims the benefit of U.S. Provisional Application Ser. No. 60/207,339, filed May 30, 2000.

BACKGROUND OF THE INVENTION

1. Field of the Invention

The present invention relates to a system for detecting faults in the insulation of conductors in motors and, more particularly, to a system for detecting insulation faults bysensing the ground leakage current flowing in the ground wire cable of the motor drive circuit.

2. Description of the Related Art

High dv/dt switching of PWM inverter motor drive systems results in multiple paths of common mode leakage current in the motor drive system. A generalized circuit diagram of a motor drive system is provided in FIG. 1. As shown in FIG. 1, the common mode leakage paths exist in the:

1. Capacitance coupling 2 between the grounded heatsink and the high voltage switching devices (i.e., IGBTs, etc.);
2. Capacitance coupling 4 between the motor lead cable and the grounded conduit or a cable tray;
3. Capacitance coupling 6 between stator winding of a motor and the motor frame through insulation material.

Leakage paths 2 and 4 above do not vary over time in the operation of an AC motor drive inverter system. Thus, for capacitance coupling path 2, the rate of change of voltage at switching instances (dv/dt) does not vary as a function of time or aging so long as the gate drive impedance stays the same. Therefore, the resulting common mode leak current does not change over time. Likewise, with respect to capacitance coupling path 4, since motor lead cabling does not change over time, the common mode leak current associated with this capacitance coupling path does not change.

Capacitance coupling 6, between the motor stator winding and the frame through insulation material, will, however, vary over time as a result of insulation deterioration within the motor. It is important to detect this insulation degradation in order to prevent catastrophic motor insulation breakdown.

SUMMARY OF THE INVENTION

The present invention provides a circuit for detecting motor insulation degradation by monitoring the common mode leakage current flowing in the ground wire cable of the motor controller circuit. More specifically, as the motor insulation degrades, the dielectric characteristics of the insulation also change. This insulation degradation manifests itself at the ground cable from the motor frame as an increase of common mode leakage current. At the end of the motor life, the common mode leakage current is so significant that it can be detected by the motor drive control system.

The present invention thus provides a circuit for detecting motor insulation degradation by detecting the common mode leakage current in the ground wire cable of the motor. In a first preferred embodiment, the circuit of the present invention includes a current sensor (for example, a small current transformer) for sensing current flowing in the ground wire cable), a single pole low pass filter for generating an average leakage current signal from the sensed leakage current, a pulse width modulator circuit connected to the current transformer and the low pass filter for generating a pulse width modulated signal representative of the common mode leakage current, a pulse generator receiving the pulse width modulated signal and generating a pulse signals at the rising and falling edges of the pulse modulated signal, a pair of level shifters for transposing the voltage level of the pulse signals from a floating high voltage level to a voltage level referenced to ground, and a pulse reconstruction circuit for receiving the level shifted pulse signals and reconstructing the pulse width modulated signal at the voltage level referenced to ground which is representative of the magnitude of the common mode leakage current and can be inputted directly to a microcontroller or a digital signal processor to determine the amount of motor insulation degradation.

In a second embodiment of the present invention, a second winding on a toroidal core, in addition to a winding connected to an active EMI filter amplifier, is used to sense the common mode leakage current signal flowing in the ground wire cable. This embodiment of the invention advantageously generates a common mode leakage signal referenced to the low side ground, and accordingly, the sensed signal need not be transposed and is simply conditioned and fed to a peak detector circuit, the output of which may be compared to a threshold value to generate an insulation fault trip signal.

In a further embodiment of the present invention, the common mode leakage current is sensed by a transformer core located on a DC bus link, rather than on the ground bus. In this configuration, the normal mode current is automatically canceled and only the common mode current is sensed.

Other features and advantages of the present invention will become apparent from the following description of the invention which refers to the accompanying drawings.

DETAILED DESCRIPTION OF THE PREFERRED EMBODIMENTS

Figure 1:
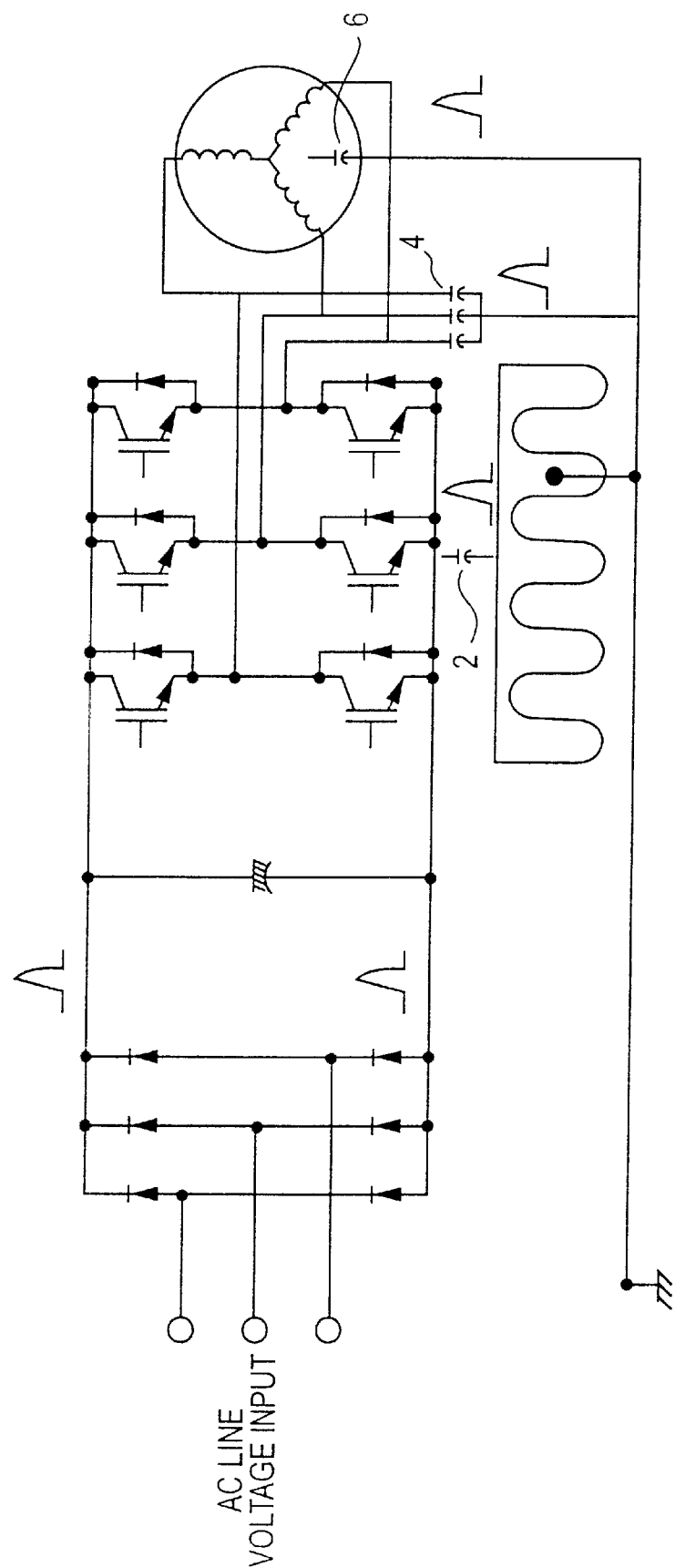
FIG. 1 is a generalized schematic of a motor drive circuit, showing the various common mode current leakage paths.
Figure 2:
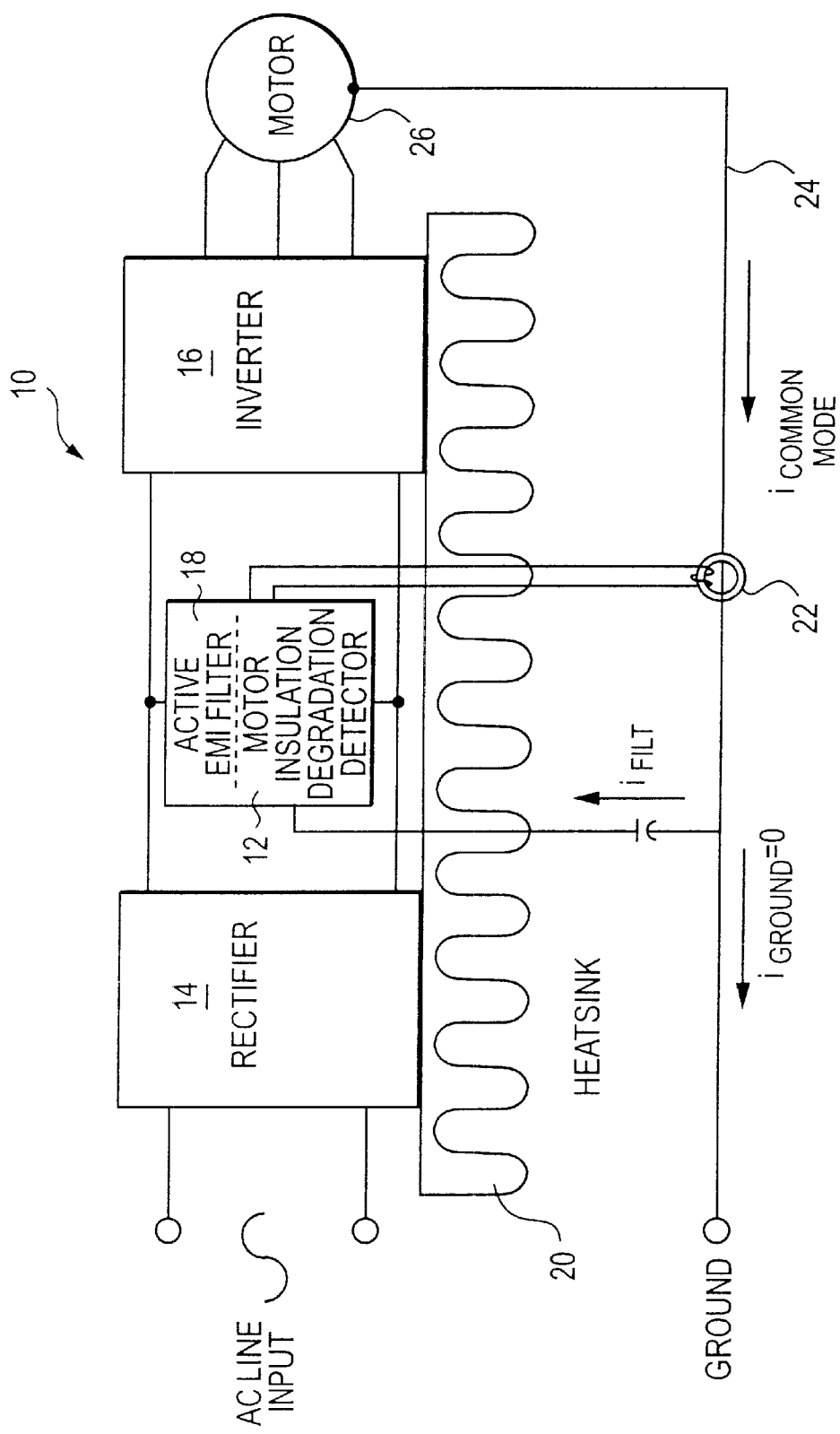
FIG. 2 shows a block diagram of a first embodiment of the common mode leakage current sensing circuit of the present invention.

Referring to FIG. 2, a schematic of a motor controller 10 is shown with a sensing circuit 12 according to the present invention. The motor controller processes an AC line input by way of rectifier 14 and inverter 16, and includes an active EMI filter 18. The motor controller is shown mounted on a heatsink 20.

Figure 3:
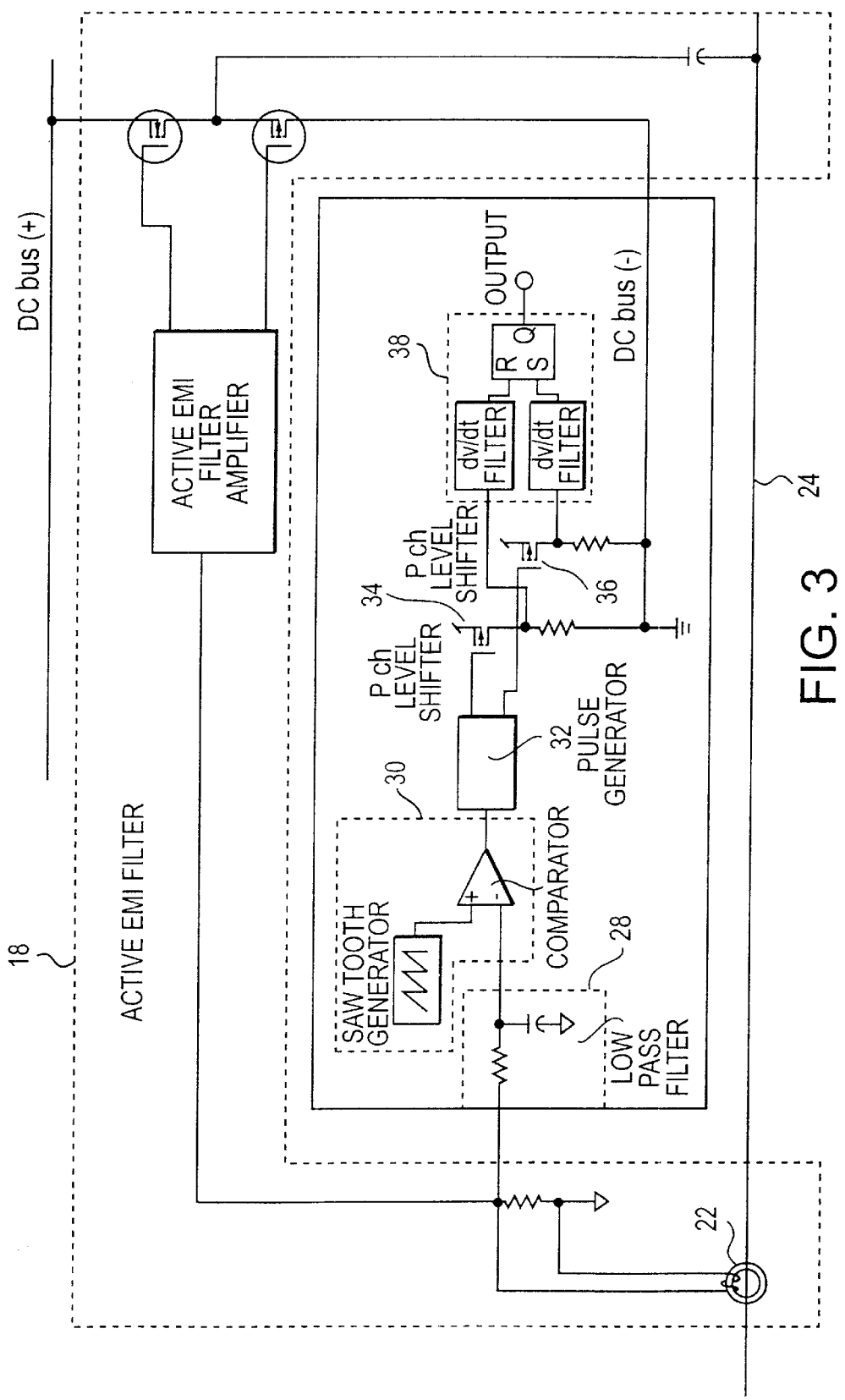
FIG. 3 shows a detailed block diagram of the sensing circuit of FIG. 2.

Motor insulation degradation sensing circuit 12 utilizes a small current transformer 22 which detects the common mode leakage current $i_{COMMON\ MODE}$ flowing in the ground wire cable 24 of motor 26. Referring to the detailed schematic of FIG. 3, sensing circuit 12 utilizes a single pole low pass filter 28 to generate an average leakage current signal $i_{FILT}$. This signal is passed to a digitizing (PWM) circuit 30 in which the current signal is compared to a generated saw tooth. The PWM signal is passed to a pulse generator 32, which generates pulses at the rising and falling edges of the PWM signal. The voltage level of these pulse signals is transposed from the floating high side to low side ground via a pair of level shifters 34, 36. A pulse reconstruction circuit 38 generates a discrete, pulse width modulated signal as an output.

The output signal from pulse reconstruction circuit 38 has a duty cycle which varies with respect to the magnitude of the common mode leakage current $i_{COMMON\ MODE}$. The signal can be supplied directly to a microcontroller or a digital signal processor to calculate and determine the amount of motor insulation degradation.

Figure 4:
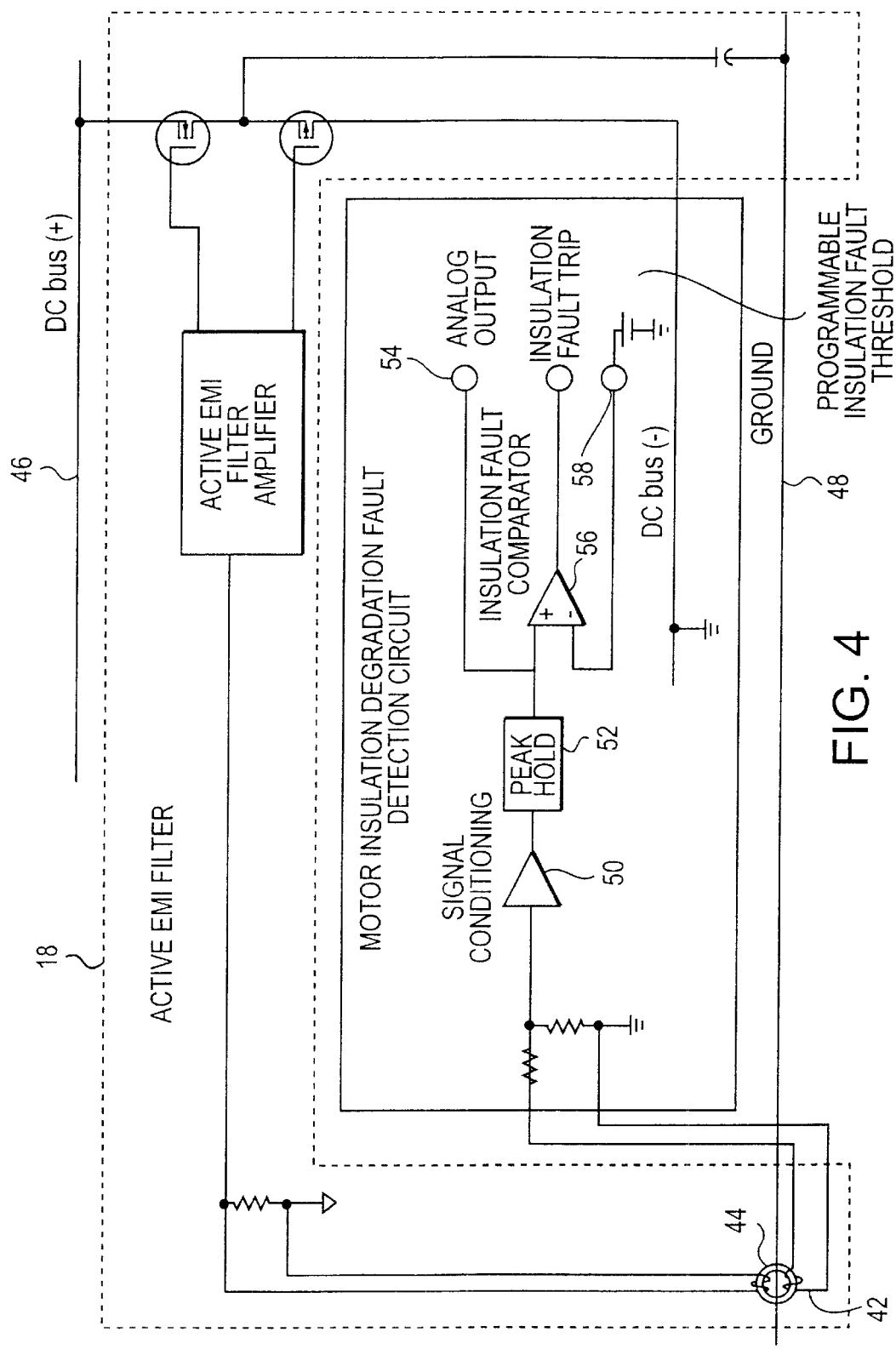
FIG. 4 is a block diagram of an alternative embodiment of the fault detection circuit of the present invention.

Referring to FIG. 4, an alternative fault detection circuit 40 is shown. The circuit is realized by adding another winding 42 on a toroidal core 44 as a common mode leakage current signal pickup. Advantageously, signal transfer from floating high side 46 to low side ground 48, which is referenced to the negative DC bus voltage potential, ("DC bus(-)") as shown in FIG. 4, is not required since the additional winding automatically provides level transformation. The leakage current signal from additional sensing winding 42 is fed to a signal conditioning circuit block 50, followed by a peak detector circuit 52. The output of peak detector 52 is an analog signal 54 which can be directly interfaced with an analog-to-digital converter of a digital or microcontroller system. This analog output signal 54 is also compared, via a comparator 56, against the programmed insulation fault threshold level 58 to generate an insulation fault trip signal.

Figure 5:
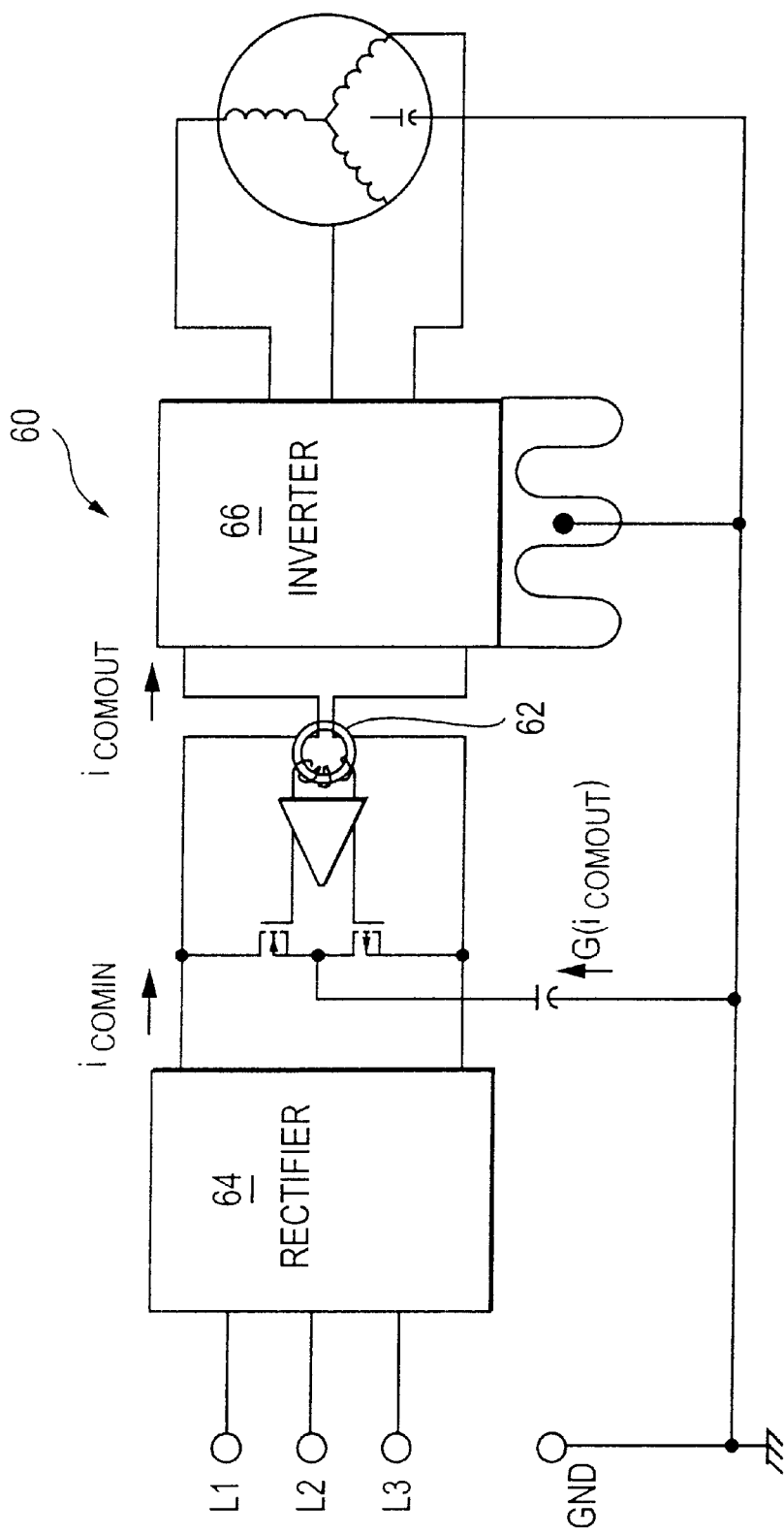
FIG. 5 is a block diagram of a further alternative embodiment of the fault detection circuit of the present invention.

Referring to FIG. 5, a further alternative embodiment of the present invention is shown. In motor controller circuit 60 of FIG. 5, common mode leakage current is sensed by a transformer core 62 located on the DC bus link voltage, rather than on the ground bus.

The motor controller circuit 60 shown in FIG. 5 includes a rectifier 64 and an inverter 66. Both DC bus wires go through common mode leak current pick-up core. As a result, all normal mode current is automatically canceled and only the common mode current component appears. The sensor is shown in FIG. 5 as a transformer core 62, but it need not be a ferrite or magnetic transformer core. Rather, a Anisotopic Magneto Resistive (AMR) sensing element or a Hall effect senor or any other device which can detect common mode current.

Although the present invention has been described in relation to particular embodiments thereof, many other variations and modifications and other uses will become apparent to those skilled in the art. Therefore, the present invention is to be limited not by the specific disclosure herein, but only by the following claims.

What is claimed is:

1. A method of detecting insulation degradation in stator windings of a motor driven by a PWM switched motor controller the method comprising the steps of:

detecting common mode dv/dt related leakage current using a sensing circuit in the motor controller; and comparing the detected common mode leakage current to a fault threshold.

2. A PWM switched motor controller including:

a rectifier circuit;

an inverter circuit including switched semiconductor devices for providing current for each phase of a motor, the semiconductor devices being driven on and off by a PWM control circuit;

a ground wire between the motor controller and a driven motor; and a circuit for monitoring degradation of the winding insulation of a motor driven by the motor controller according to changes in the common mode leakage current in the ground wire due to dv/dt of the switched semiconductor devices, comprising:

a current sensor coupled to the ground wire that generates an output signal representative of the common mode leakage current;

a single pole low pass filter responsive to the output signal from the current sensor that generates an output signal representing the average value of the common mode leakage current;

a pulse width modulator circuit responsive to the output signal from the low pass filter, that generates a first pulse width modulated output signal representative of the average value of the common mode leakage current;

a pulse generator operative to generate pulse signals at the rising and falling edges of the pulse width modulated signal;

a pair of level shifters operative to convert the pulse signals from a floating high voltage level to a voltage level referenced to ground; and a latching circuit response to the level shifted pulse signals to generate output signals referenced to ground, the durations of which represent the magnitude of the common mode leakage current; and a comparison circuit responsive to the output signals from the latching circuit, and operative to generate an indication signal when the common mode leakage current reaches a value corresponding to a predetermined amount of motor insulation degradation.

3. The PWM switched motor controller of claim 2, wherein the current sensor is a transformer core.

4. The PWM switched motor controller of claim 2, wherein the current sensor is located on a ground.

5. The PWM switched motor controller of claim 2 further including:

an active EMI filter having an input coupled to the output of the current sensor and an output coupled to the ground wire, the EMI filter being operative to deliver a noise cancellation signal to the ground wire.

6. A PWM switched motor controller including:

a rectifier circuit;

an inverter circuit including switched semiconductor devices for providing current for each phase of a motor, the semiconductor devices being driven on and off by a PWM control circuit;

a ground wire between the motor controller and a driven motor; and a circuit for monitoring degradation of the winding insulation of a motor driven by the motor controller according to changes in the common mode leakage current in the ground wire due to dv/dt of the switched semiconductor devices, comprising:

a current sensor coupled to the ground wire that generates a first output signal representative of the common mode leakage current;

a peak detection and holding circuit responsive to the first output signal from the current sensor that generates an output signal representing the value of the common mode leakage current; and a comparison circuit responsive to the output signals from the peak detection and holding circuit, and operative to generate an indication signal when the common mode leakage current reaches a value corresponding to a predetermined amount of motor insulation degradation; and an active EMI filter having an input responsive to a second output from the current sensor and having an output coupled to the ground wire, the EMI filter being operative to deliver a noise cancellation signal to the ground wire.

7. The PWM switched motor controller of claim 6, wherein the current sensor is comprised of a current transformer having a furst output winding connected to an input of peak detection and holding circuit the and a second output winding connected to the input of the active EMI filter.

8. A PWM switched motor controller including:

a rectifier circuit;

an inverter circuit including switched semiconductor devices for providing current for each phase of a motor, the semiconductor devices being driven on and off by a PWM control circuit;

a ground wire between the motor controller and a driven motor; and a circuit for monitoring degradation of the winding insulation of a motor driven by the motor controller according to changes in the common mode leakage current in the ground wire due to dv/dt of the switched semiconductor devices, comprising:

a current sensor coupled to the ground wire and responsive to the common mode leakage current;

a detection circuit coupled to the current sensor that generates an output signal representing the value of the common mode leakage current; and a comparison circuit responsive to the output signals from the peak detection and holding circuit, and operative to generate an indication signal when the common mode leakage current reaches a value corresponding to a predetermined amount of motor insulation degradation; and an active EMI filter having an input coupled to the current sensor and having an output coupled to the ground wire, the EMI filter being operative to deliver a noise cancellation signal to the ground wire.

* * * * *